United States Patent
Prasad et al.

(10) Patent No.: US 11,171,571 B2
(45) Date of Patent: Nov. 9, 2021

(54) ALTERNATING CURRENT SOLID-STATE SWITCH

(71) Applicant: GM GLOBAL TECHNOLOGY OPERATIONS LLC, Detroit, MI (US)

(72) Inventors: Rashmi Prasad, Troy, MI (US); Chandra S. Namuduri, Troy, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 174 days.

(21) Appl. No.: 16/674,576

(22) Filed: Nov. 5, 2019

(65) Prior Publication Data

US 2021/0135588 A1 May 6, 2021

(51) Int. Cl.
| | |
|---|---|
| *H02M 5/293* | (2006.01) |
| *H01L 27/06* | (2006.01) |
| *H01L 25/07* | (2006.01) |
| *H01L 23/52* | (2006.01) |
| *H02M 3/28* | (2006.01) |
| *H02M 1/42* | (2007.01) |
| *G01R 1/04* | (2006.01) |
| *H01L 29/772* | (2006.01) |
| *H01L 25/065* | (2006.01) |

(52) U.S. Cl.
CPC .......... *H02M 5/293* (2013.01); *G01R 1/0491* (2013.01); *H01L 23/52* (2013.01); *H01L 25/0655* (2013.01); *H01L 25/072* (2013.01); *H01L 27/0629* (2013.01); *H01L 29/772* (2013.01); *H02M 1/4258* (2013.01); *H02M 3/285* (2013.01)

(58) Field of Classification Search
CPC ............... H02M 5/293; H01L 27/0629; H01L 25/0655; H01L 25/072; H01L 23/52
USPC ........................................ 257/288, 734, 784
See application file for complete search history.

(56) References Cited

U.S. PATENT DOCUMENTS

| 7,183,616 B2* | 2/2007 | Bhalla .................... H01L 25/072 257/401 |
| 10,665,398 B1* | 5/2020 | Namuduri ............. H01L 23/053 |
| 2014/0042564 A1* | 2/2014 | Tsai ...................... H04L 49/109 257/415 |

* cited by examiner

*Primary Examiner* — Robert T Huber
(74) *Attorney, Agent, or Firm* — Quinn IP Law

(57) ABSTRACT

An AC electronic solid-state switch includes an electrically insulating and thermally conductive layer, a first electrically conductive trace, a second electrically conductive trace, and a plurality of semiconductor dies each electrically connected to the first electrically conductive trace and the second electrically conductive trace. Each of the plurality of semiconductor dies forms a MOSFET, IGBT or other types of electronically controllable switch. The AC electronic solid-state switch further includes a common drain conductor that is electrically connected to each drain terminal of the plurality of semiconductor dies. The AC electronic solid-state switch is configured to block between 650 volts and 1700 volts in the off-state in a first direction and a second direction, the second direction being opposite the first direction, and the AC electronic solid-state switch is configured to carry at least 500 A continuously in the on-state with a voltage drop of less than 2V.

20 Claims, 6 Drawing Sheets

ALTERNATING CURRENT SOLID-STATE SWITCH

INTRODUCTION

The present disclosure relates to electrical components, and more specifically, alternating current (AC) electronic solid-state switches and assemblies.

Existing High Voltage, high current electromechanical relays are bulky (i.e., with a mass greater than 0.5 kg), have slow switching speeds (i.e., switching speed greater than 10 ms) and are prone to contact welding during high current switching due to contact bounce. Further, existing, electromechanical relays produce customer annoying audible noise during switching. Therefore, there is a need to develop a switch that is lightweight, has fast switching speeds, and is reliable. Further, for fault tolerant and/or dual-purpose applications, it may be useful to efficiently control for some solid-state in both directions. For example, for efficient control of reconfigurable storage in both charging and discharging modes, bidirectionally controllable solid-state switches with low voltage drops are useful.

SUMMARY

The presently disclosed AC electric solid-state switch is capable of blocking at least between 650 volts and 1700 volts bidirectionally during the off-state. Further, the AC electronic solid-state switch continuously carries at least 500 amperes direct current during the on-state with a voltage drop of less than two volts. Moreover, the AC electronic solid-state switch has a mass that is equal to or less than three hundred grams. The AC electronic solid-state switch has a maximum width between 65 millimeters and 70 millimeters, a maximum length between 85 millimeters and 95 millimeters, and a maximum height of 25 millimeters, thereby minimizing the size of the switch assembly In an aspect of the present disclosure, the AC electronic solid-state switch may include a base plate, an electrically insulating and thermally conductive layer disposed on the base plate, a first electrically conductive trace disposed on the electrically insulating and thermally conductive layer, a second electrically conductive trace disposed on the electrically insulating and thermally conductive layer, and a plurality of semiconductor dies each electrically connected to the first electrically conductive trace and the second electrically conductive trace. Each of the plurality of semiconductor dies forms a MOSFET, an IGBT or other type of electronically controllable switch. The electronically controllable switch (e.g., MOSFET) includes a gate terminal, a drain terminal, and a source terminal. The AC electronic solid-state switch further includes a common drain conductor that is electrically connected to each drain terminal of the plurality of semiconductor dies. Each of the plurality of semiconductor dies is disposed on the common drain conductor. The AC electronic solid-state switch has an on-state and an off-state, wherein the AC electronic solid-state switch is configured to block between 650 volts and 1700 volts in the off-state in a first direction and a second direction, the second direction being opposite the first direction, and the AC electronic solid-state switch is configured to carry at least 500 A continuously in the on-state with a voltage drop of less than 2V.

Each drain terminal of the plurality of semiconductor dies may be directly connected to the common drain conductor. The common drain conductor may be the sole drain conductor. Each of the plurality of semiconductor dies may be in direct contact with the common drain conductor. The semiconductor dies may be electrically connected in parallel with each other.

The AC electronic solid-state switch may further include a plurality of signal conductors. The signal conductors may be electrically connected to the semiconductor dies. The signal conductors may include a plurality of gate conductors and a plurality of source conductors.

The AC electronic solid-state switch further include a plurality of electrical bonds. The electrical bonds include wire bonds and ribbon bonds. Each source terminal of the plurality of semiconductor dies may be electrically connected to the plurality of source conductors. The ribbon bonds electrically may connect the plurality of semiconductor dies to the source conductors.

Each gate terminal of the semiconductor dies may be electrically connected to the plurality of gate conductors. The wire bonds electrically may connect the semiconductor dies to the plurality of gate conductors. Each of the semiconductor dies has a minimum area of twenty square millimeters. The thickness of the base plate may be between two millimeters and three millimeters, and the base plate includes copper. The semiconductor dies include between eight and twenty-four semiconductor dies each with a voltage rating between 650V and 1700V. The specific-on resistance of each semiconductor die is less than 4.5 mΩ-cm$^2$. The mass of the AC electronic solid-state switch may be less than three-hundred grams.

In an aspect of the present disclosure, The AC electronic solid-state switch may include a base plate, an electrically insulating and thermally conductive layer disposed on the base plate, and a first electrically conductive trace disposed on the electrically insulating and thermally conductive layer. The first electrically conductive trace is a first drain conductor. The AC electronic solid-state switch further includes a second electrically conductive trace disposed on the electrically insulating and thermally conductive layer. The second electrically conductive trace is a second drain conductor. The AC electronic solid-state switch further includes a plurality of semiconductor dies each electrically connected to the first electrically conductive trace and the second electrically conductive trace. Each of the semiconductor dies forms a MOSFET, and the MOSFET includes a gate terminal, a drain terminal, and a source terminal. The semiconductor dies include a first group of semiconductor dies and a second group of semiconductor dies. The first group of semiconductor dies is disposed on the first electrically conductive trace. The second group of semiconductor dies is disposed on the second electrically conductive trace. The AC electronic solid-state switch may include a common source conductor that is electrically connected to each source terminal of the plurality of semiconductor dies. Each of the semiconductor dies is disposed on the common source conductor. The AC electronic solid-state switch has an on-state and an off-state. The AC electronic solid-state switch is configured to block between 650 volts and 1700 volts in the off-state in a first direction and a second direction. The second direction being opposite the first direction, and the AC electronic solid-state switch is configured to carry at least 500 A continuously in the on-state with a voltage drop of less than 2V.

Each source terminal of the semiconductor dies may directly connect to the common source conductor. The common source conductor may be the sole source conductor. Each of the first group of semiconductor dies may be in direct contact with the first electrically conductive trace. Each of the second group of semiconductor dies may be in direct contact with the second electrically conductive trace. Each of the plurality of semiconductor dies may be electrically connected in parallel with each other.

The AC electronic solid-state switch further includes a plurality of signal conductors. Each of the plurality of signal conductors may be electrically connected to the plurality of semiconductor dies. The signal conductors may include a plurality of gate conductors. The AC electronic solid-state switch may further include a plurality of electrical bonds. The electrical bonds may include wire bonds and ribbon bonds. Each source terminal of the semiconductor dies may be electrically connected to the common source conductor. The ribbon bonds may electrically connect the plurality of semiconductor dies to the common source conductor. Each gate terminal of the plurality of semiconductor dies may be electrically connected to the plurality of gate conductors. The wire bonds may electrically connect the plurality of semiconductor dies to the plurality of gate conductors. Each of the plurality of semiconductor dies may have a minimum area of twenty square millimeters. The thickness of the base plate may be between two millimeters and three millimeters, and the base plate may include copper aluminum, molybdenum or alloys thereof or metal matrix composites such as AlSiC.

The AC electronic solid-state switch may include between eight and twenty-four semiconductor dies each with a voltage rating between 650V and 1700V. The specific-on resistance of each semiconductor die is less than 4.5 mΩ-cm$^2$. The mass of the AC electronic solid-state switch is less than three-hundred grams.

The above features and advantages, and other features and advantages, of the present teachings are readily apparent from the following detailed description of some of the best modes and other embodiments for carrying out the present teachings, as defined in the appended claims, when taken in connection with the accompanying drawings.

DETAILED DESCRIPTION

The following detailed description is merely exemplary in nature and is not intended to limit the application and uses. Furthermore, there is no intention to be bound by expressed or implied theory presented in the preceding introduction, summary or the following detailed description.

Embodiments of the present disclosure may be described herein in terms of functional and/or logical block components and various processing steps. It should be appreciated that such block components may be realized by a number of hardware, software, and/or firmware components configured to perform the specified functions. For example, an embodiment of the present disclosure may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments of the present disclosure may be practiced in conjunction with a number of systems, and that the systems described herein are merely exemplary embodiments of the present disclosure.

For the sake of brevity, techniques related to signal processing, data fusion, signaling, control, and other functional aspects of the systems (and the individual operating components of the systems) may not be described in detail herein. Furthermore, the connecting lines shown in the various figures contained herein are intended to represent example functional relationships and/or physical couplings between the various elements. It should be noted that alternative or additional functional relationships or physical connections may be present in an embodiment of the present disclosure.

Figure 1:
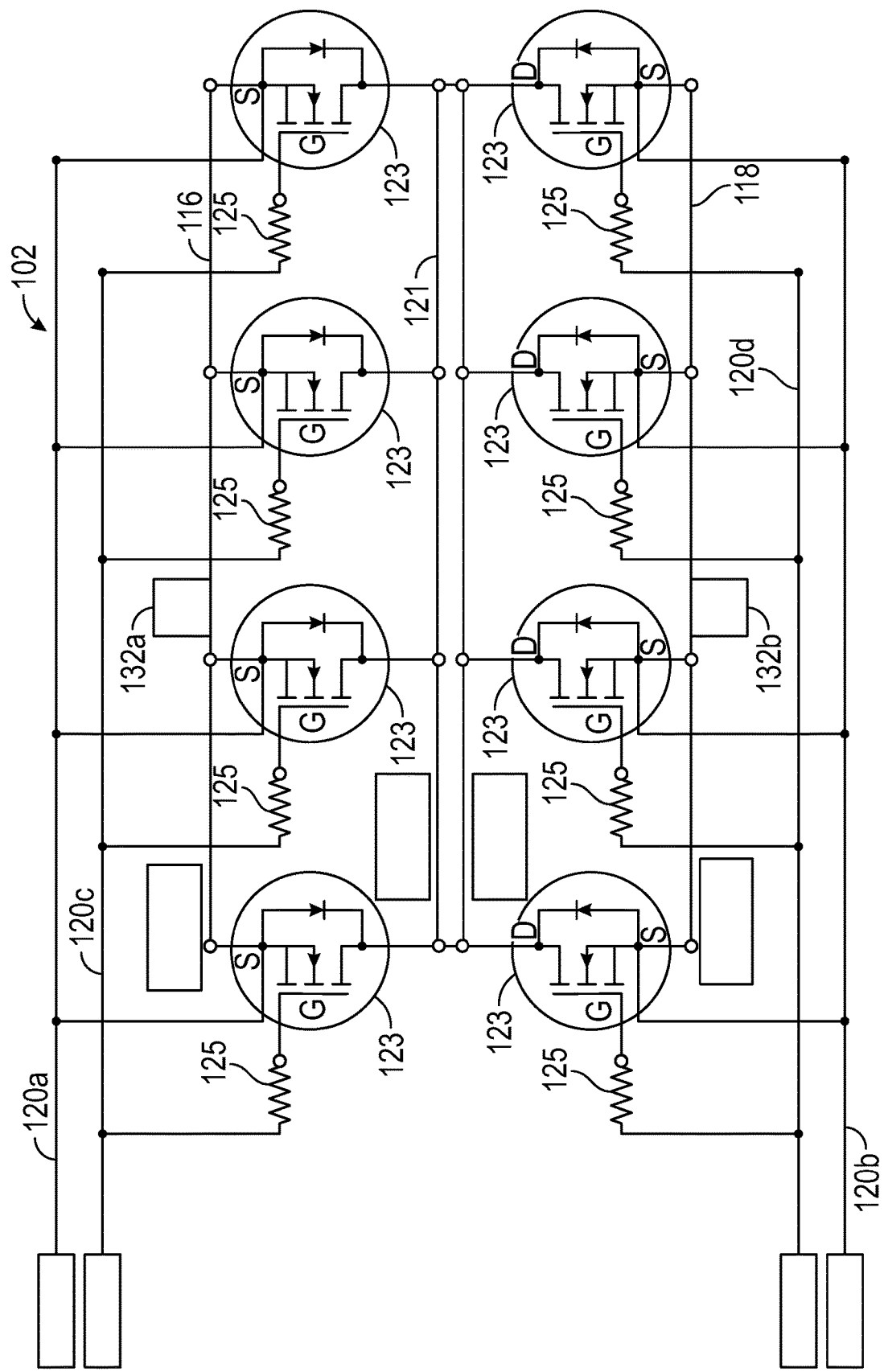
FIG. 1 is a schematic circuit diagram of an AC electronic solid-state switch having a common drain conductor.
Figure 2:
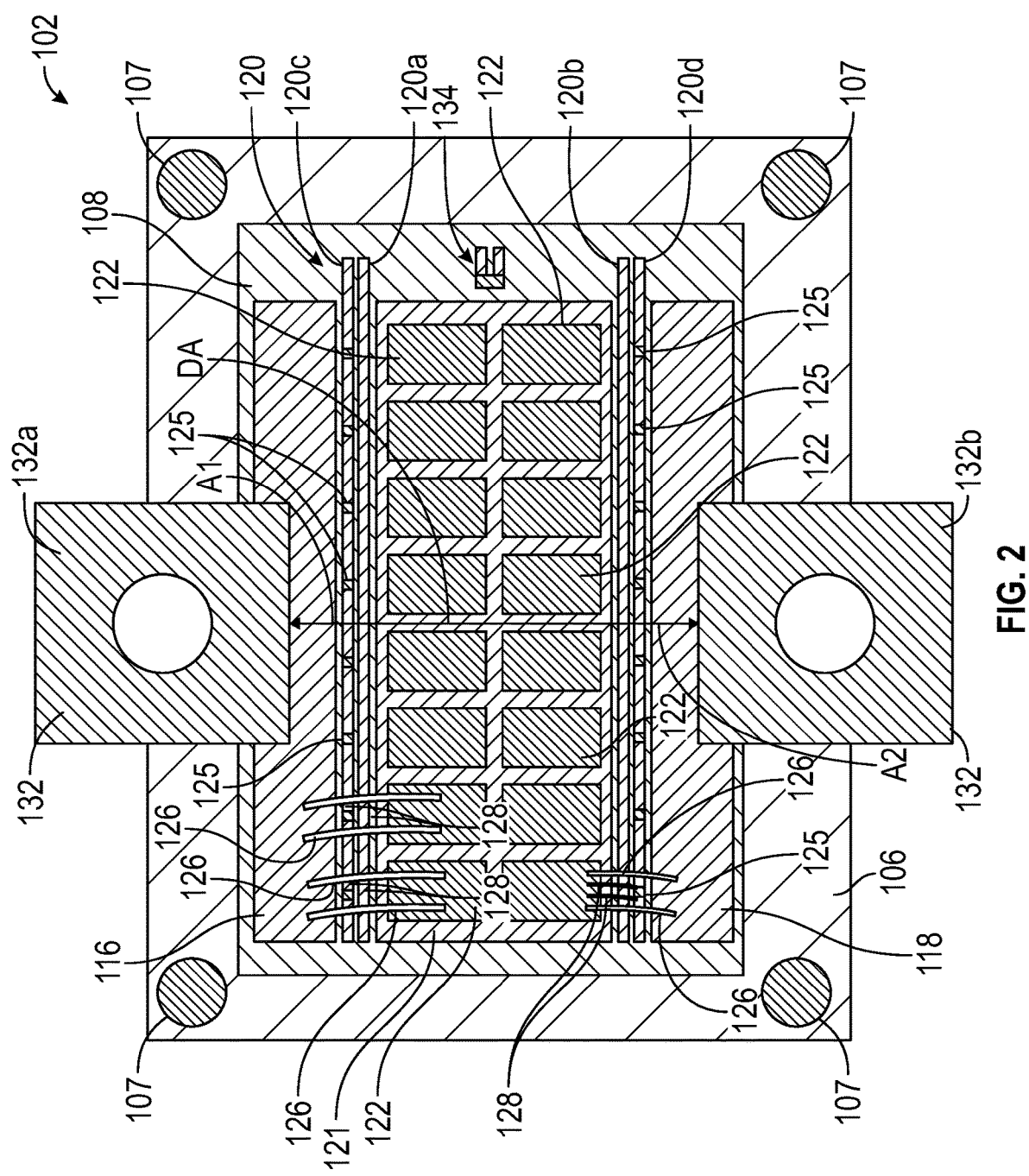
FIG. 2 is a schematic top view of the AC electronic solid-state switch of FIG. 1.

With reference to FIGS. 1 and 2, an AC electronic solid-state switch 102 has an off-state and an on-state and may be part of a switch assembly. The switch assembly may additionally include a polymeric case for holding and encapsulating the AC electronic solid-state switch 102 and retaining hardware. Due to its configuration as described below, the AC electric solid-state switch 102 is capable of blocking between 650 volts and 1700 volts bidirectionally (as indicated by double arrows DA) during the off-state. The double arrows indicate a first direction A1 and a second direction A1 that is opposite to the first direction A2. Due to its configuration as described below, the AC electronic solid-state switch continuously carries at least 500 amperes direct current during the on-state with a voltage drop of less than two volts. Due to its configuration as described below, the AC electronic solid-state switch 102 has a mass that is equal to or less than 300 grams. Due to its configuration as described below, the switch assembly (and therefore the AC electronic solid-state switch 102) has a maximum width between 65 millimeters and 70 millimeters, a maximum length between 85 millimeters and 95 millimeters, and a maximum height of 25 millimeters, thereby minimizing the size of the switch assembly.

The AC electronic solid-state switch 102 includes a base plate 106 having mounting holes on opposite sides of the base plate 106. The maximum thickness of the base plate 106 may between two millimeters and three millimeters to minimize the overall size of the AC electronic solid-state switch 102. Further, the base plate 106 has an essentially planar shape (and therefore flat configuration) to minimize the overall size of the AC electronic solid-state switch 102. In addition, the base plate 106 may be wholly or partly made of an electrically conductive material, such as a metal. For example, the base plate 106 may be wholly or partly made of copper and may be mounted to a heat sink. The base plate 106 may optimally have pin-fins. The base plate 106 may include holes 107 for mounting to another structure.

The AC electronic solid-state switch 102 includes an electrically insulating and thermally conductive layer 108 disposed on (although not directly on) the base plate 106. The electrically insulating and thermally conductive layer 108 may be wholly or made of a ceramic material. Suitable ceramic materials for the electrically insulating and thermally conductive layer 108 include, but are not limited, to aluminum oxide ($Al_2O_3$), Aluminum Nitride (AlN), Aluminum Silicon Carbide (AlSiC), Silicone Nitride ($Si_3N_4$), Diamond, Gallium Oxide, among others. The electrically insulating and thermally conductive layer 108 may be part of a direct bonded substrate, such as a direct bonded aluminum (DBA) substrate or a direct bonded copper (DBC) substrate, and its thickness may be between 0.1 millimeters and 0.4 millimeters. In addition to the electrically insulating and thermally conductive layer 108, the directed bonded substrate includes a metallic sheet bonded to the electrically insulating and thermally conductive layer 108.

A solder layer may be disposed between the base plate 106 and the electrically insulating and thermally conductive layer 108 to couple the base plate 106 to the electrically insulating and thermally conductive layer 108. The term "solder" means a low-melting alloy, especially one based on lead and tin or (for higher temperatures) on brass or silver, used for joining less fusible metals. The solder layer may be directly disposed on the base plate 106 to facilitate and enhance the connection between the solder layer and the base plate 106. Each of the base plate 106, the electrically insulating and thermally conductive layer 108, and the solder layer may have a planar shape to minimize the size coupled by the AC electronic solid-state switch 102.

The AC electronic solid-state switch 102 further includes a first electrically conductive trace 116 directly disposed on the electrically insulating and thermally conductive layer 108 to minimize the size occupied by the AC electronic solid-state switch 102. The first electrically conductive trace 116 is directly disposed on (and directly bonded to) the electrically insulating and thermally conductive layer 108 to enhance the structural integrity of the AC electronic solid-state switch 102. The first electrically conductive trace 116 has a planar shape to minimize its size and is directly connected to a first power terminal 132a. Further, the first electrically conductive trace 116 is wholly or partly made of a metallic material, such as copper, aluminum, and/or an alloy thereof.

The AC electronic solid-state switch 102 further includes a second electrically conductive trace 118 directly disposed on the electrically insulating and thermally conductive layer 108 to minimize the space occupied by the AC electronic solid-state switch 102. For instance, the second electrically conductive trace 118 is directly disposed on (and directly bonded to) the electrically insulating and thermally conductive layer 108. The second electrically conductive trace 118 has a planar shape to minimize its size and is directly connected to a second power terminal 132b. Further, the electrically conductive trace 118 is made of a metallic material, such as copper, aluminum, and/or an alloy thereof.

The AC electronic solid-state switch 102 further includes a plurality of signal conductors 120 (i.e., source conductors and gate conductors) directly disposed on the electrically insulating and thermally conductive layer 108. The signal conductors 120 includes a first source conductor 120a, a second source conductor 120b, a first gate conductor 120c and a second gate conductor 120d. The first electrically conductive trace 116 may have a rectangular shape to facilitate manufacturing. The second electrically conductive trace 118 may also have a rectangular shape to facilitate manufacturing. The first source conductor 120a, the second source conductor 120b, the first gate conductor 120c, and the second gate conductor 120d are wholly or partly made of a metallic material, such as copper or aluminum, and are directly bonded to the electrically insulating and thermally conductive layer 108 (e.g., ceramic layer). The control inputs carried through the signal conductors 120 draw near zero power (i.e., less than one watt) keep to the AC electronic solid-state switch 120 ON or OFF, and the AC electronic solid-state switch 102 is configured to selectively control the current flow in either direction as indicated by double arrows DA.

The AC electronic-solid state switch 102 further includes a common drain conductor 121 directly disposed on electrically insulating and thermally conductive layer 108. The common drain conductor 121 may be the sole drain conductor in the AC electronic solid-state switch 102 to minimize the complexity of the AC electronic-solid state switch 102. The common drain conductor 121 may have a rectangular shape to facilitate manufacturing, and may be wholly or partly made of a metallic material, such as copper or aluminum. The first source conductor 120a and the first gate conductor 120c are disposed between the first electrically conductive trace 116 and the common drain conductor 121. The second source conductor 120b and the second gate conductor 120d are disposed between the common drain conductor 121 and the second electrically conductive trace 118.

The AC electronic solid-state switch 102 includes a plurality of semiconductor dies 122 each disposed directly on the common drain source 121 to facilitate the flow of electricity. Although the depicted embodiment shows sixteen semiconductor dies 122, the AC electronic solid-state switch 102 includes between eight and twenty-four semiconductor dies 122 (each with a voltage rating from 650 volts to 1700 volts) to electrically connected to one another in parallel to carry a 500 A current and enhance scalability. Each of the plurality of semiconductor dies 122 forms a metal-oxide-semiconductor filed-effect transistor (MOSFET) 123, an insulated-gate bipolar transistor (IGBT) or other type of electronically controllable switch. Accordingly, element 123 may refer to a MOSFET, an IGBT, or other type of electronically controllable switch. The MOSFET 123 includes a source terminal S, a gate terminal G, and a drain terminal D. Each of the semiconductor dies 122 has a minimum area of twenty square millimeters to carry 400 A current.

Each of the plurality of semiconductor dies 122 includes a semiconductor material, such as silicon, silicon carbide, gallium oxide, and gallium nitride. The semiconductor dies 122 are arranged in a predetermined placement on top of the direct bonded substrate to maintain substantially equal resistance between the first power terminal 132a and the second power terminal 132b in each semiconductor die 122. The bottom side of each of the semiconductor dies 122 is directly coupled to the common drain conductor 121. Each of the semiconductor dies 122 has a specific on-resistance that is less than 4.5 m-$\Omega$ $cm^2$. The placement of the semiconductor dies 122 and the pattern of the direct bonded substrate 108 achieve equal current distribution and low parasitic inductance. The AC electronic solid-state switch 102 may include a plurality of damping resistors 125 each electrically connected to the gate terminal G of a respective MOSFET 123 in series to the prevent or at least minimize power oscillations. The plurality of semiconductor dies 122 are electrically connected in parallel with one another.

The AC electronic solid-state switch 102 includes a first plurality of electrical bonds 126 each electrically connected to a respective one of the plurality of semiconductor dies 122. Specifically, each of the first plurality of electrical bonds 126 electrically connects the source terminal S of a respective MOSFET 123 to either the first electrically conductive trace 116 or the second electrically conductive trace 118. Each of the first plurality of electrical bonds 126 electrically interconnects the plurality of semiconductor dies 122 and the second electrically conductive trace 118. Each of the first plurality of electrical bonds 126 may be a high current, aluminum or copper ribbon bond or a foil bond to minimize parasitic inductance and resistance. For simplicity, solely three semiconductor dies 122 are shown with electrical bonds 126 being attached to either the first electrically conductive trace 116 or the second electrically conductive trace 118. However, each of semiconductor die 122 is attached to two electrical bonds 126.

The AC electronic solid-state switch 102 further includes a second plurality of electrical bonds 128 each electrically connecting the plurality of signal conductors 120 to the plurality of semiconductor dies 122. Specifically, each of the second plurality of electrical bonds 128 electrically connects the gate terminal G or a source terminal S of a respective MOSFET 123 to the first source conductor 120a, the second source conductor 120b, the first gate conductor 120c, or the second gate conductor 120d. The second plurality of electrical bonds 128 may be short, low current wire bonds to minimize parasitic inductance and resistance. For simplicity, solely three semiconductor dies 122 are shown with the second plurality of electrical bonds 128 being attached to the signal conductors 120. However, each of semiconductor die 122 is attached to two of the second plurality of electrical bonds 128.

The AC electronic solid-state switch 102 may include a plurality of power terminal 132 (e.g., a first power terminal 132a and a second power terminal 132b as shown in FIG. 2). The first power terminal 132a is directly coupled to (and electrically connected to) the first electrically conductive trace 116. The second power terminal 132b is directly coupled to (and electrically connected to) the second electrically conductive trace 118. The power terminals 132 are electrically isolated from the base plate 106.

The AC electronic solid-state switch 102 may optionally include one or more thermistors 134 as shown in FIG. 2 directly connected to the direct bonded substrate 115 to measure (with optimal accuracy) the temperature of the AC electronic solid-state switch 102. The thermistors 134 measure and monitor the temperature of the AC electronic solid-state switch 102.

Figure 3:
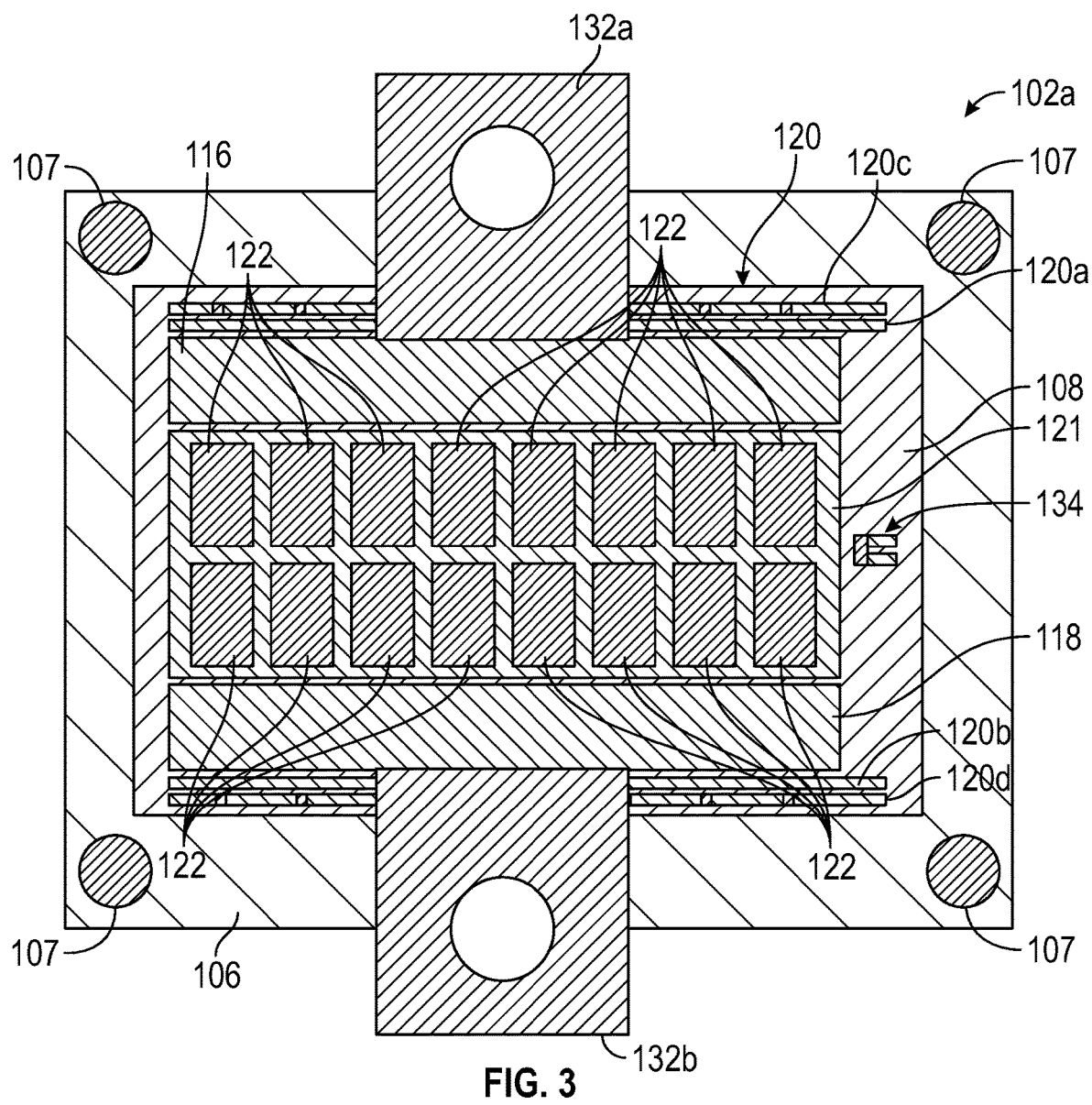
FIG. 3 is a schematic top view of an AC electronic solid-state switch having a common drain conductor in accordance with another aspect of the present disclosure.
Figure 4:
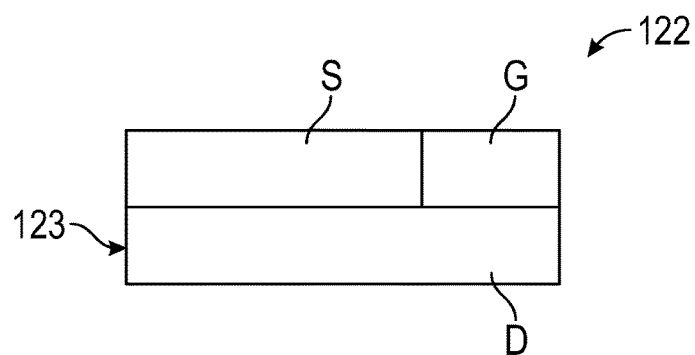
FIG. 4 is a schematic, front view of a semiconductor die of the AC electronic solid-state switch of FIG. 1.

With respect to FIG. 3, the structure and function of the AC electronic solid-state switch 102a is substantially identical to the AC electronic solid-state switch 102 described above, except for the features described below. The first electrically conductive trace 116 is disposed between the first source conductor 120a and common drain conductor 121. The second electrically conductive trace 118 is disposed between the second source conductor 120b and the common drain conductor 121. This configuration facilitates manufacturing and enhances reliability.

Figure 5:
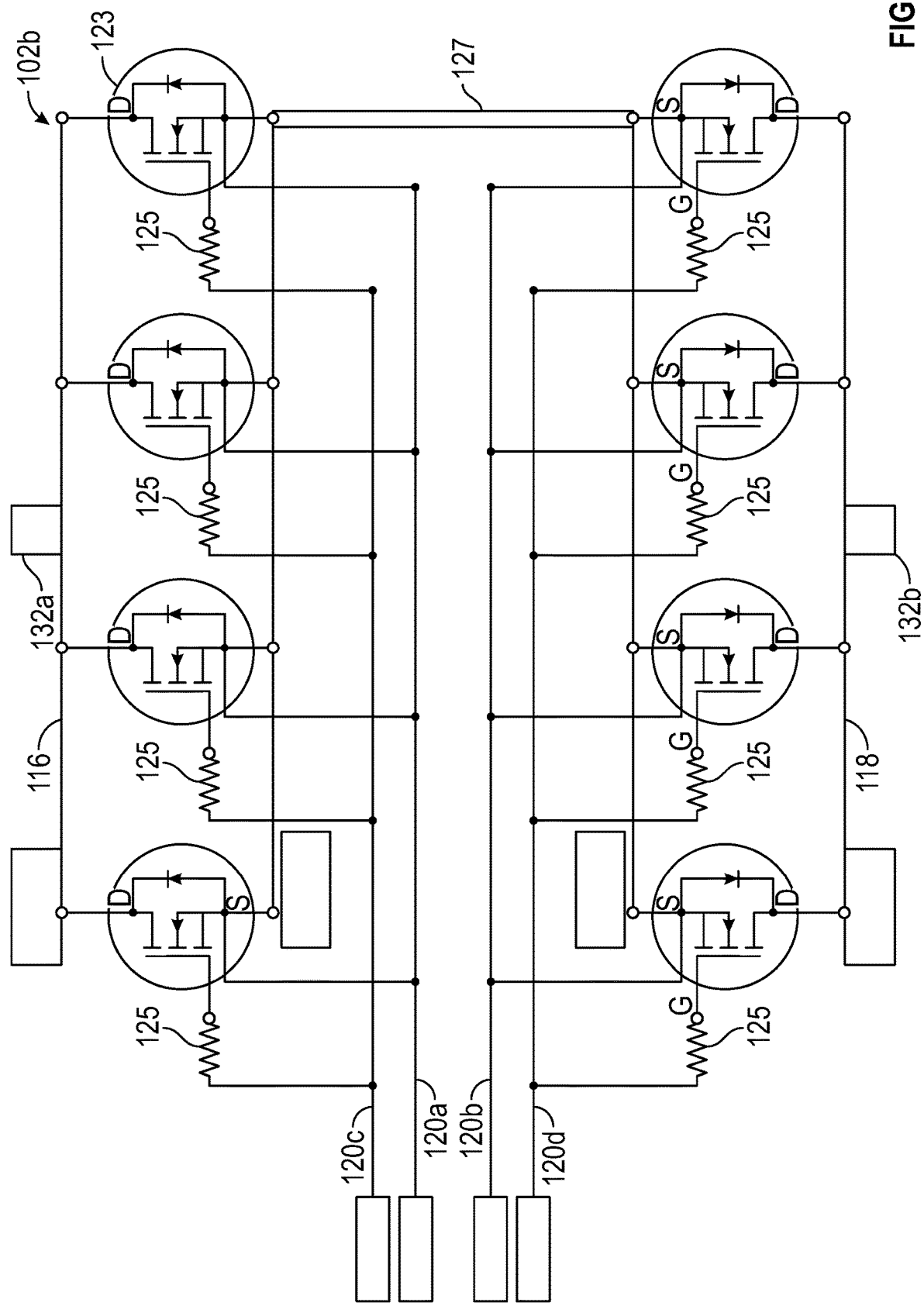
FIG. 5 is schematic circuit diagram of an AC electronic solid-state switch having a common source conductor.
Figure 6:
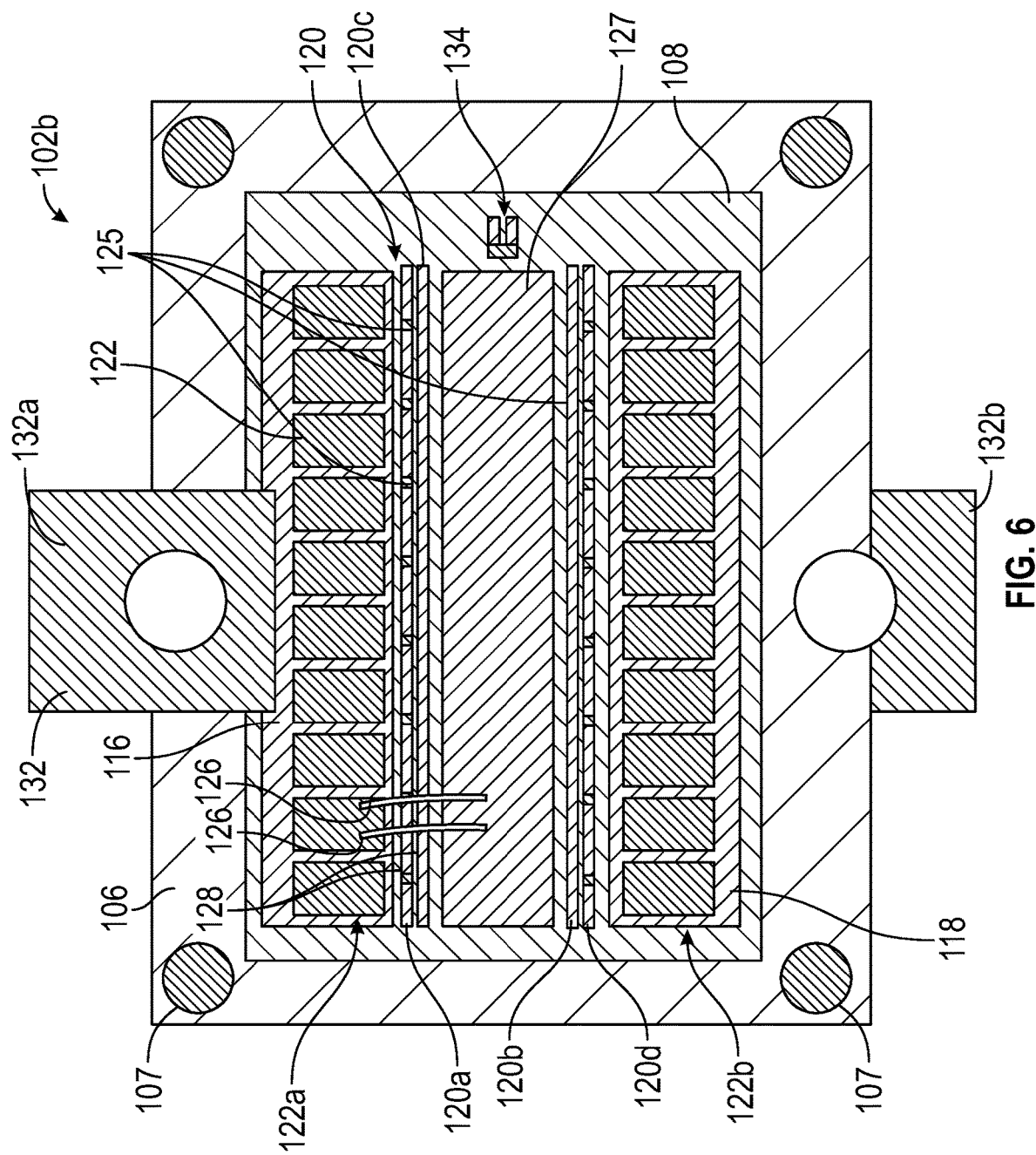
FIG. 6 is a schematic top view of the AC electronic solid-state switch of FIG. 4.

With reference to FIGS. 5 and 6, the structure and function of the AC electronic solid-state switch 102b is substantially identical to the AC electronic solid-state switch 102 described above, except for the features described below. The semiconductor dies 122 are directly disposed on the first electrically conductive trace 116 and the second electrically conductive trace 118. The drain terminal D of the MOSFET 123 are electrically (and directly) connected to either the first electrically conductive trace 116 or the second electrically conductive trace 118. Hence, the first electrically conductive trace 116 may be referred to as a first drain conductor 120, and the second electrically conductive trace 118 may be referred to as a second drain conductor. Further, the semiconductor dies 122 includes a first group of semiconductor dies 122a and a second group of semiconductor dies 122b. The semiconductor dies 122 are electrically connected in parallel with each other. Each of the first group of semiconductor dies 122a is directly disposed (and in direct contact with) the first electrically conductive trace 116 to enhance the structural integrity of the AC electronic solid-state switch 102. Each of the second group of semiconductor dies 122b is directly disposed on (and in direct contact with) the second electrically conductive trace 118 to enhance the structural integrity of the AC electronic solid-state switch 102. The AC electronic solid-state switch 102 further includes a common source conductor 127 electrically connected to each of the semiconductor dies 122 through the first plurality of electrical bonds 126 (e.g., ribbon bonds). The first source conductor 120a and the first gate conductor 120c are disposed between the first electrically conductive trace 116 and the common source conductor 127. The second source conductor 120b and the second gate conductor 120d are disposed between the common source conductor 127 and the second electrically conductive trace 118. The common source conductor 127 is the sole source conductor to minimize the complexity of the AC electronic solid-state switch 102.

Figure 7:
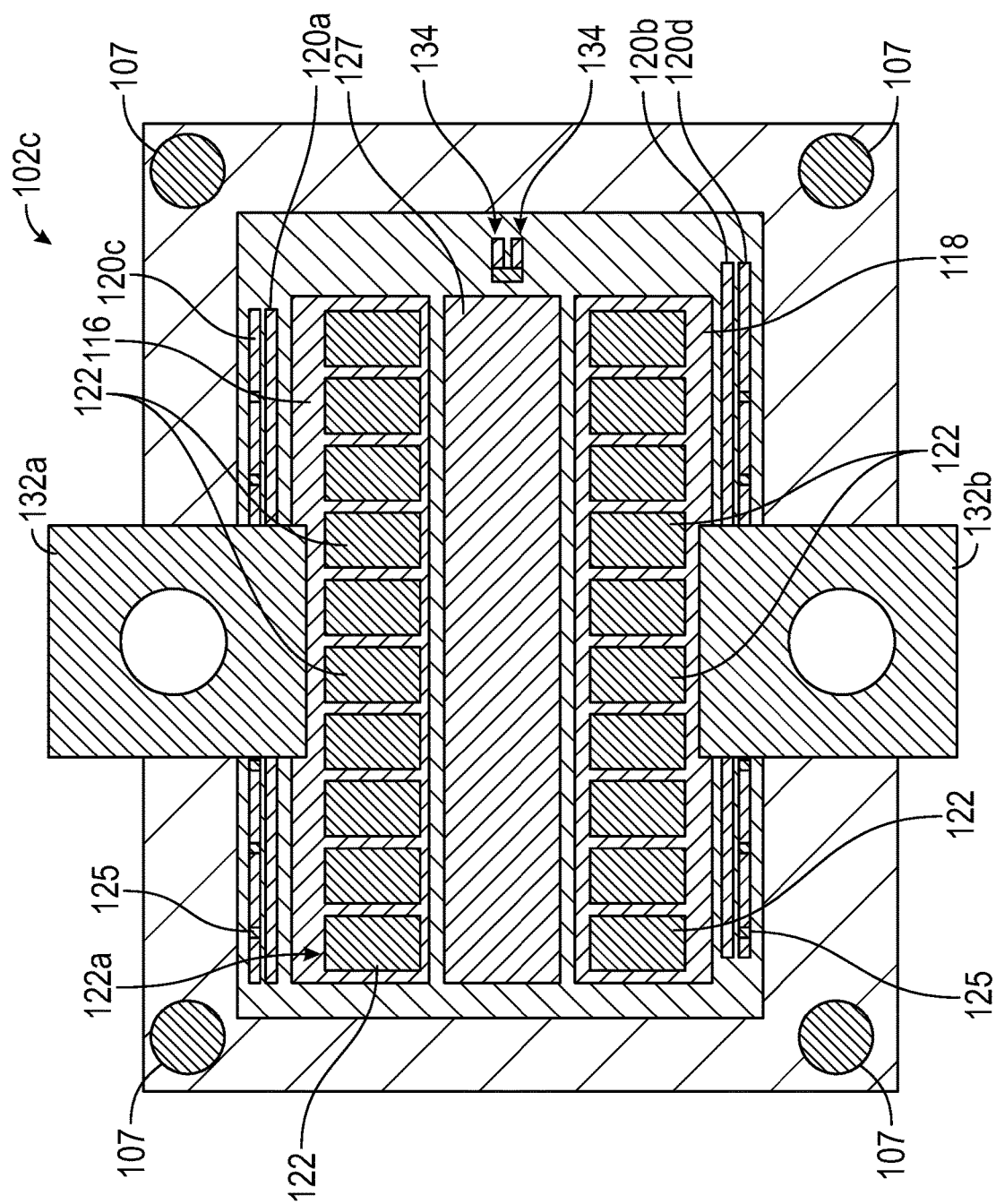
FIG. 7 is a schematic top view of an AC electronic solid-state switch having a common drain conductor in accordance with another aspect of the present disclosure

With reference to FIG. 7, the structure and function of the AC electronic solid-state switch 102c is substantially identical to the AC electronic solid-state switch 102b described above, except for the features described below. The first electrically conductive trace 116 is disposed between the first source conductor 120a and common source conductor 127. The second electrically conductive trace 118 is disposed between the second source conductor 120b and the common source conductor 127. This configuration facilitates manufacturing and enhances reliability.

The detailed description and the drawings or figures are supportive and descriptive of the present teachings, but the scope of the present teachings is defined solely by the claims. While some of the best modes and other embodiments for carrying out the present teachings have been described in detail, various alternative designs and embodiments exist for practicing the present teachings defined in the appended claims.

What is claimed is:

1. An alternating current (AC) electronic solid-state switch, comprising:
 an electrically insulating and thermally conductive layer;
 a first electrically conductive trace disposed on the electrically insulating and thermally conductive layer;
 a second electrically conductive trace disposed on the electrically insulating and thermally conductive layer;
 a plurality of semiconductor dies each electrically connected to the first electrically conductive trace and the second electrically conductive trace, wherein each of the plurality of semiconductor dies forms a MOSFET, and the MOSFET includes a gate terminal, a drain terminal, and a source terminal;
 a common drain conductor that is electrically connected to each drain terminal of the plurality of semiconductor dies, wherein each of the plurality of semiconductor dies is disposed on the common drain conductor; and
 wherein the AC electronic solid-state switch has an on-state and an off-state, wherein the AC electronic solid-state switch is configured to block between 650 volts and 1700 volts in the off-state in a first direction and a second direction, the second direction being opposite the first direction, and the AC electronic solid-state switch is configured to carry at least 500 A continuously in the on-state with a voltage drop of less than 2V.

2. The AC electronic solid-state switch of claim 1, further comprising a base plate, wherein the electrically insulating and thermally conductive layer is disposed on the base plate, each drain terminal of the plurality of semiconductor dies is directly connected to the common drain conductor, wherein the common drain conductor is a sole drain conductor, each of the plurality of semiconductor dies is in direct contact with the common drain conductor, and the plurality of semiconductor dies are electrically connected in parallel with each other.

3. The AC electronic solid-state switch of claim 2, further comprising a plurality of signal conductors, wherein the plurality of signal conductors is electrically connected to the plurality of semiconductor dies, and the plurality of signal conductors include a plurality of gate conductors and a plurality of source conductors.

4. The AC electronic solid-state switch of claim 3, further comprising a plurality of electrical bonds, the plurality of electrical bonds includes wire bonds and ribbon bonds, wherein each source terminal of the plurality of semiconductor dies is electrically connected to the plurality of source conductors, and the ribbon bonds electrically connect the plurality of semiconductor dies to the plurality of source conductors.

5. The AC electronic solid-state switch of claim 4, wherein each gate terminal of the plurality of semiconductor dies is electrically connected to the plurality of gate conductors, and the wire bonds electrically connect the plurality of semiconductor dies to the plurality of gate conductors.

6. The AC electronic solid-state switch of claim 5, wherein each of the plurality of semiconductor dies has a minimum area of twenty square millimeters.

7. The AC electronic solid-state switch of claim 6, wherein a thickness of the base plate is between two millimeters and three millimeters, and the base plate includes copper.

8. The AC electronic solid-state switch of claim 7, wherein the plurality of semiconductor dies includes between eight and twenty-four semiconductor dies each with a voltage rating between 650V and 1700V.

9. The AC electronic solid-state switch of claim 8, wherein a specific-on resistance of each semiconductor die is less than 4.5 mΩ-cm$^2$.

10. The AC electronic solid-state switch of claim 9, wherein a mass of the AC electronic solid-state switch is less than three-hundred grams.

11. An alternating current (AC) electronic solid-state switch, comprising:
    an electrically insulating and thermally conductive layer;
    a first electrically conductive trace disposed on the electrically insulating and thermally conductive layer, wherein the first electrically conductive trace is a first drain conductor;
    a second electrically conductive trace disposed on the electrically insulating and thermally conductive layer, wherein the second electrically conductive trace is a second drain conductor;
    a plurality of semiconductor dies each electrically connected to the first electrically conductive trace and the second electrically conductive trace, wherein each of the plurality of semiconductor dies forms an electronically controllable switch, the plurality of semiconductor dies includes a first group of semiconductor dies and a second group of semiconductor dies, the first group of semiconductor dies is disposed on the first electrically conductive trace, and the second group of semiconductor dies is disposed on the second electrically conductive trace;
    a common source conductor that is electrically connected to each source terminal of the plurality of semiconductor dies, wherein each of the plurality of semiconductor dies is disposed on the common source conductor; and
    wherein the AC electronic solid-state switch has an on-state and an off-state, wherein the AC electronic solid-state switch is configured to block between 650 volts and 1700 volts in the off-state in a first direction and a second direction, the second direction being opposite the first direction, and the AC electronic solid-state switch is configured to carry at least 500 A continuously in the on-state with a voltage drop of less than 2V.

12. The AC electronic solid-state switch of claim 11, further comprising a base plate, wherein the electrically insulating and thermally conductive layer is disposed on the base plate, each source terminal of the plurality of semiconductor dies is directly connected to the common source conductor, wherein the common source conductor is a sole source conductor, each of the first group of semiconductor dies is in direct contact with the first electrically conductive trace, each of the second group of semiconductor dies is in direct contact with the second electrically conductive trace, and each of the plurality of semiconductor dies are electrically connected in parallel with each other, the electronically controllable switch is at least chosen from a MOSFET and an IGBT, and the MOSFET includes a gate terminal, a drain terminal, and a source terminal.

13. The AC electronic solid-state switch of claim 12, further comprising a plurality of signal conductors, wherein each of the plurality of signal conductors is electrically connected to the plurality of semiconductor dies, and the plurality of signal conductors include a plurality of gate conductors.

14. The AC electronic solid-state switch of claim 13, further comprising a plurality of electrical bonds, wherein the plurality of electrical bonds includes wire bonds and ribbon bonds, each source terminal of the plurality of semiconductor dies is electrically connected to the common source conductor, and the ribbon bonds electrically connect the plurality of semiconductor dies to the common source conductor.

15. The AC electronic solid-state switch of claim 14, wherein each gate terminal of the plurality of semiconductor dies is electrically connected to the plurality of gate conductors, and the wire bonds electrically connect the plurality of semiconductor dies to the plurality of gate conductors.

16. The AC electronic solid-state switch of claim 15, wherein each of the plurality of semiconductor dies has a minimum area of twenty square millimeters.

17. The AC electronic solid-state switch of claim 16, wherein a thickness of the base plate is between two millimeters and three millimeters, and the base plate includes at least one chosen from copper, aluminum, molybdenum, alloys thereof, and metal matrix composites.

18. The AC electronic solid-state switch of claim 17, wherein the plurality of semiconductor dies includes between eight and twenty-four semiconductor dies each with a voltage rating between 650V and 1700V.

19. The AC electronic solid-state switch of claim 18, wherein a specific-on resistance of each semiconductor die is less than 4.5 mΩ-cm$^2$.

20. The AC electronic solid-state switch of claim 19, wherein a mass of the AC electronic solid-state switch is less than three-hundred grams.

\* \* \* \* \*